United States Patent [19]

Minowa et al.

[11] Patent Number: 4,697,885

[45] Date of Patent: Oct. 6, 1987

[54] DISPLAY DEVICE AND DECAL FOR FORMING A DISPLAY PANEL TERMINAL

[75] Inventors: Toshio Minowa; Tetsuro Hashimoto, both of Yokohama; Kohji Kuroda, Kasugai; Kazutaka Nakayama, Nagoya, all of Japan

[73] Assignees: Asahi Glass Company, Ltd., Tokyo; Noritake Co., Limited, Nagoya, both of Japan

[21] Appl. No.: 898,776

[22] Filed: Aug. 19, 1986

Related U.S. Application Data

[63] Continuation of Ser. No. 556,371, Nov. 30, 1983, abandoned.

[30] Foreign Application Priority Data

Dec. 1, 1982 [JP] Japan .................................. 57-209301
Oct. 11, 1983 [JP] Japan .................................. 58-188428

[51] Int. Cl.⁴ .......................... G02F 1/13; H01B 13/10; H01R 4/00
[52] U.S. Cl. .......................... 350/334; 156/52; 156/239; 156/306.6; 174/94 R; 439/68; 439/77
[58] Field of Search .................. 174/94 R, 168, 177, 174/178; 350/334; 339/275 C, DIG. 3, 17 B, 17 T, 17 R; 156/230, 239, 241, 306.9, 306.6, 307.7, 313, 324.4, 52; 228/179

[56] References Cited

U.S. PATENT DOCUMENTS

| | | | |
|---|---|---|---|
| 2,721,822 | 10/1955 | Pritikin | 156/233 |
| 3,006,795 | 10/1961 | Brickell | . |
| 3,729,819 | 5/1973 | Horie | 156/52 |
| 3,770,874 | 11/1973 | Krieger et al. | 339/275 C |
| 3,950,200 | 4/1976 | Muramoto et al. | 156/235 |
| 3,981,761 | 9/1976 | Kojima et al. | 156/235 |
| 4,113,981 | 9/1978 | Fujita et al. | 174/94 R |
| 4,179,322 | 12/1979 | Brown et al. | 156/233 |
| 4,330,353 | 5/1982 | Kunimoto et al. | 156/324.4 |
| 4,362,903 | 12/1982 | Eichelberger et al. | 174/94 R |
| 4,453,997 | 6/1984 | Horie | 156/306.9 |

FOREIGN PATENT DOCUMENTS

| | | |
|---|---|---|
| 55-16388 | 5/1980 | Japan . |
| 58-2824 | 1/1983 | Japan . |
| 1258660 | 12/1971 | United Kingdom . |
| 2064233 | 7/1981 | United Kingdom . |

OTHER PUBLICATIONS

"A New Connection Approach to Liquid Crystal Display Instrument for Automobiles", T. Minowa et al; R. & D. Division, Asahi Glass Publ., #830039 (Feb. 1982).

*Primary Examiner*—Donald E. Czaja
*Assistant Examiner*—Louis Falasco
*Attorney, Agent, or Firm*—Oblon, Fisher, Spivak, McClelland, & Maier

[57] ABSTRACT

After the process of manufacturing a cell of a display device, a thick film conductor is bonded onto the terminal portion of a transparent electrode of the display panel by a dry or wet transfer mounting method and a flexible printed circuit board for a driver is soldered on the thick film conductor, such a display device; a process for producing the display device; and a decal for dry or wet transfer mounting method to form a display panel terminal are disclosed.

7 Claims, 11 Drawing Figures

DISPLAY DEVICE AND DECAL FOR FORMING A DISPLAY PANEL TERMINAL

This application is a continuation of application Ser. No. 556,371, filed Nov. 30, 1983, now abandoned.

BACKGROUND OF THE INVENTION

1. Field of the Invention

The present invention relates to a display device wherein after the process of manufacturing a cell, a solderable terminal of a thick film conductor is formed on a transparent electrode of a display panel by using a dry or wet transfer mounting method so that the display panel is connected to a driver circuit mounted on a flexible film; a process for producing such a display device; and a decal for forming a display panel terminal.

2. Discussion of the Background

FIG. 1 shows a cross sectional view of a conventional display device, particularly a liquid crystal display device. Upper and lower base plates 1 and 2 having electrodes 4 made of a transparent conductive coating film are bonded under pressure to each other with a space of from 5 to 10 $\mu$m by a sealing material 3 and sealed by e.g. heating or ultraviolet irradiation. Then, a liquid crystal material 5 is filled through a liquid crystal inlet formed on the side surface of the sealing material 3 or on the lower base plate 2, and the liquid crystal inlet is then sealed by a sealing material such as a resin. If necessary, additional elements such as polarizer 6, a color polarizer, a color filter, an ultraviolet absorbing filter, a reflector 7, a light-conductive plate, a quarter wave plate or a light source, may be laminated, and various printed patterns or non-glare treatment may be applied to the surface. A double-layered structure may be employed for the liquid crystal layer or for the electrode layer. The lower base plate 2 may be made of a reflective base plate or a semiconductor substrate. A predetermined voltage is applied to the electrodes of the liquid crystal display panel thus prepared, to display predetermined letters, characters or patterns. Various modes for the display are available such as a dynamic scattering mode, a field effect mode or a guest-host mode.

The overall structure of a liquid crystal display device comprises the above-mentioned liquid crystal display panel and a driver circuit connected thereto. Namely, an IC chip 9 is mounted on a printed circuit board 8. In most cases, a conductive elastomer 10 is disposed between the terminal portion of transparent electrode of the liquid crystal display panel and the terminal portion of the print circuit board so that the electrodes are mutually connected by the conductive elastomer 10. However, in the display device wherein the conductive elastomer 10 is employed, the display panel is not securely fixed to the print circuit board since the device is fabricated by closely spaced contacts, whereby it is likely that the conductive elastomer 10 moves and brings about a failure in the connection. Further, a failure in the electrical conduction is likely to be led by the deformation of the conductive elastomer 10, caused by closely spaced contacts, whereby an additional step for correcting the failure is required.

These problems increase as the size of the panel increases, and a new technique for the processing is required.

Furthermore, with respect to the design of the display device, when a conventional conductive elastomer is used, there is a drawback that the display area is restricted by the holder material for the conductive elastomer. These problems are attributable to closely spaced contacts for electrical connection between the display panel and the drive circuit. Therefore, it is desirable to employ a bonding method wherein the electrode terminal of the display panel and the driver circuit are connected by soldering.

Methods for forming a terminal portion of electrode of the panel include (1) a thick film method by screen printing (i.e. a direct printing method), (2) a thin film method by vapour deposition or sputtering, (3) a plating method, and (4) a dispenser method with a conductor paste (i.e. a coating method).

However, none of these methods is totally satisfactory since each method has its own demerit as described below.

Namely, in the thick film method by screen printing (direct printing method), when the thickness of a seal to connect the upper and lower base plates of the display panel is from 5 to 10 $\mu$m and the thickness of the conductor at the terminal to be formed is from 12 to 20 $\mu$m, the resulting printed sheet material will tend to warp. Consequently, when the sheet material is cut into separate pieces, the respective base plates are likely to be cracked or broken, or due to the warping, the cell gap of the liquid crystal display cell tends to be locally widened, whereby the response speed, the legibility or the outer appearance will be impaired. Furthermore, for the same reasons as mentioned above with respect to the cell gap, it becomes difficult to employ a conventional method to obtain a plurality of liquid crystals display cells by cutting them out from the sheet material. Thus, it is thereby difficult to obtain a desired cell gap, whereby the productivity is remarkably lowered.

The thin film method requires a step of vapour deposition or sputtering, whereby the productivity will be lowered and the cost will be increased. Moreover, there will be a problem such as corrosion of the transparent conductive coating film due to pin holes or scars which are likely to be occurred thereon.

In the plating method, the adhesive strength of the deposited film is inadequate in many cases. According to the dispenser method, the dimensional precision is poor, and it is difficult to form fine patterning.

SUMMARY OF THE INVENTION

It is an object of the present invention to overcome the above-mentioned drawbacks thereby to provide a display device having a superior strength and durability, wherein the display panel is reliably connected to the print circuit board, particularly the flexible print circuit board, of the driver circuit and the display panel terminal is readily formed; a process for the production of the display device and a decal for forming the display panel terminal. The present invention is particularly preferably applicable to a liquid crystal display panel and a process for its production.

The object of the present invention is attained by forming a solderable thick film conductor on a transparent electrode terminal of a display panel by the application of a dry transfer mounting technique or a wet transfer mounting technique to a cell after filling the liquid crystal material to the liquid crystal display cell, and bonding by soldering the print circuit board of a driver circuit to the thick film conductor so formed.

Namely, the display device of the present invention is a new display device wherein a thick film conductor is bonded onto the portion to be formed lead terminal on a transparent electrode of the display panel and a flexible print circuit board is soldered on the thick film conductor, the new display device being characterized in that the thick film conductor is formed by a transfer mounting method. The term "transparent electrode" is meant for an electrode which is capable of transmitting light, i.e. the electrode may not necessarily be completely transparent.

The display device of the present invention has superior strength and durability, wherein the display panel and the print circuit board, particularly the flexible print circuit board, can be connected reliably, and the rigid and durable terminal can readily be formed.

A preferred process for producing the display device of the present invention is as follows.

The process for producing the display device of the present invention is new one which comprises bonding a thick film conductor on the terminal portion of a transparent electrode of a display panel and connecting by soldering a flexible print circuit board to the thick film conducting terminal, the new one being characterized in that the thick film conductor is obtained by transferring the conductive coat of a decal onto the lead terminal portion of the transparent electrode by transfer mounting method using the decal having the conductive coat and then hardening the conductive coat as bonded.

Further, the decal for forming a display panel terminal to be used in the process of the production of the display device is as follows.

The decal of the present invention is a dry transfer decal having a conductive coat on a film alone or on a laminated paper comprising a film laminated to be able to release on a base sheet (carrier sheet), or a wet transfer decal comprising a conductive coat formed on a releasable base sheet and a top coat of a resin film laminated on the conductive coat.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

In the display device of the present invention, a thick film conductor is bonded onto the lead terminal portion of a transparent electrode of the display panel by a transfer mounting method. This thick film conductor preferably has a double-layered structure comprising a first layer of a low conductive material corresponding to the transparent electrode terminal side and a second layer of a highly conductive material corresponding to the flexible print circuit board side. From the viewpoint of bonding the film conductor to the transparent electrode and soldering it to the flexible print circuit board, it is preferred that the low conductive material for the first layer be composed of a thermosetting conductive material containing from 50 to 90% by weight of a conductor material, and the highly conductive material for the second layer has a higher content of a conductor material than the low conductive mateiral for the first layer and be composed of a thermosetting conductive material containing from 60 to 95% by weight of a conductor material. The above-mentioned ranges of the content of the conductor material in the low conductive material layer (first layer) and in the highly conductive material layer (second layer) and those calculated as solvent free conductive material. When calculated as solvent containing conductive material, it is preferred that the low conductive material layer (first layer) contains from 20 to 70% by weight of a conductor material, and the highly conductive material layer (second layer) contains from 50 to 90% by weight of a conductor material.

Further, in the display device of the present invention, it is preferred, from the reliability point of view, that the joint portion of the thick film conductor and the flexible print circuit board is covered with a resin. As such a resin, there may be employed a thermosetting resin or a ultraviolet-setting resin such as an epoxy resin, an acrylic resin, a melamine resin or a phenol resin. Various fillers such as talc or silica powder, or additives such as a viscosity controlling agent, may be added as the case requires. Such filler or additives serve to strengthen the solder joint portion or to prevent galvanic corrosion of the exposed transparent electrode portion.

Now, the process for producing a display device of the present invention will be described in detail with reference to the drawings.

Figure 1:
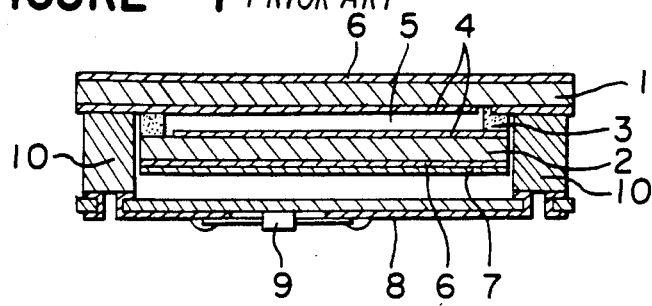
FIG. 1 shows a cross sectional view of a conventional liquid crystal display device.
Figure 2:
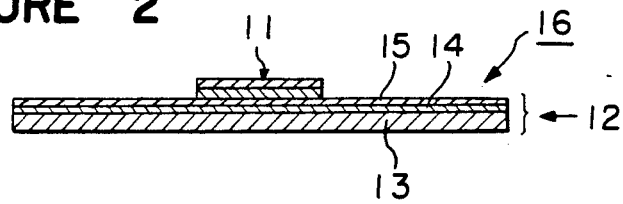
FIG. 2 shows a cross sectional view of a decal for dry transfer mounting according to the present invention.

FIG. 2 is a cross section of a decal 16 for dry transfer mounting process according to the present invention, which is of the type commonly employed as a slide transfer decal. In FIG. 2, reference numeral 13 designates a base sheet (carrier sheet), numeral 15 designates a releasable film, numeral 11 designates a double-layered conductive coat, and numeral 14 designates an adhesive layer. The decal 16 may be made of a film 15 alone or a laminated paper 12 conprising a film 15 and a base sheet 13 as shown in FIG. 2, whereby a conductive paste can be printed on the film 15 and after drying the conductive paste, the film can be released off from the base sheet at the process of transfer mounting. The conductive coat 11 may be one which can be transferred from film 15 or laminated paper 12 onto the lead terminal portion of the electrode by heating or pressing. As the base sheet 13 of this laminated paper 12, there may be employed a pulp paper or a synthetic sheet which has on one surface a releasable adhesive layer 14, such as a layer of a water soluble gum or emulsion, coated and dried.

As the releasable film 15, there may be employed a plastic film such as a polyester film, a polyethylene film or a polypropylene film, having a thickness of from 10 to 100 μm. Onto the laminated paper 12 comprising the film 15 and the base sheet 13, a conductive paste as a printing ink is printed in a desired electrode pattern and dried to form a conductive coat 11.

When a film 15 is used alone instead of the laminated paper 12, a slightly thicker plastic film having a thickness of from 25 to 300 μm may be employed.

Figure 3:
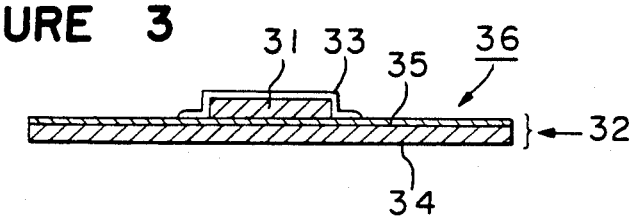
FIG. 3 shows a cross sectional view of a decal for wet transfer mounting according to the present invention.

FIG. 3 shows a cross sectional view of a wet transfer mounting decal 36 of the present invention. In FIG. 3, reference numeral 34 designates a base sheet, numeral 31 designates a conductive coat, numeral 35 designates a releasing material layer, and numeral 33 designates a top coat. This decal 36 has a wet releasing property, whereby the conductive coat 31 i.e. the printed conductive paste, can be released from the base sheet 32 coated with the releasing material layer 35 when wetted with or dipped in a liquid. On the surface of the coat 31, the top coat 33 made of a resin is formed.

The base sheet 34 used here is preferably composed of a liquid (e.g. water) absorbent base sheet 35 and a releasing material layer 35 formed thereon. On this base sheet 34 with releasing material layer, a conductive paste is printed in a desired electrode pattern to form a conductive coat 31, and the top coat 33 is formed thereon.

As the top coat 33, there may be employed various resins which can readily be peeled off from the conductive coat 31. For instance, an acrylic resin, a vinyl chloride resin or polyethylene resin may be mentioned. Particularly preferred is a thermoplastic resin. This top coat 33 remains as attached during the transfer mounting process and is removed after the transferring and drying, and then the conductive coat 31 made of a conductive paste is hardened.

The conductive paste used for the dry or wet transfer decal, is a mixture of a resin and a conductor material and may be incorporated with a viscosity controlling agent or solvent, as the case requires, to improve the printability. Most preferably, this conductive paste ink has a resin content of about 50% by weight within a viscosity range suitable for printing.

Further, in the present invention, it is preferred, for the improvement of the solderability to the flexible print circuit board and the adhesion to the transparent electrode terminal, that the conductive coat 11 or 31 obtained by printing the conductive paste in a desired pattern, should have a double-layered structure comprising a first layer of a low-conductive material containing from 50 to 90% by weight of a conductor material corresponding to the transparent electrode terminal side, and a second layer of a highly conductive material corresponding to the flexible print circuit board side, which has a higher content of a conductor mateial than the low conductive material and which contains from 60 to 95% by weight of a conductor material. In this case, a double-layered conductive paste may be employed in the same manner as mentioned above. Namely, a conductive paste containing from 20 to 70% by weight of a conductor material is used for the transparent electrode side so that a low conductive material layer containing from 50 to 90% by weight of the conductor material will be formed after the hardening of the conductive paste, whereas a conductive paste containing from 50 to 90% by weight of a conductor material is used for the flexible print circuit board side so that a highly conductive material layer containing from 60 to 95% by weight of the conductor material will be formed after the hardening of the conductive paste. It is also possible to provide at least one additional conductive material layer between the above mentioned double layers thereby to form a conductive coat 11 or 13 having a multiple-layered structure comprising at least three conductive material layers.

The conductor material may be of any type which can be printed as a mixture with a resin. For instance, a conductive powder of carbon, silver, copper, gold or nickel, or a fine conductive material such as conductive fine fibers, may be used. Among them, a base metal material such as copper or nickel is preferred as it has a minimum migration effect.

Any resin which is printable and capable of being bonded to the transparent electrode may be used. An expoxy resin, an acryl resin, a polyvinyl resin, a polyimide resin or a polyamide resin may be mentioned as typical examples.

In the present invention, the above-mentioned printing may be conducted in accordance with a conventional method. Screen printing is preferably employed. The conductive paste ink may be printed in a desired pattern once or twice on a base sheet for the above-mentioned decal by screen printing, followed by drying to form a single layered or double layered conductive coat 11 or 31. The thickness of the coating obtained by screen printing is from about 10 to 100 μm. The thickness can relatively freely changed by selecting the type of the screen, and the printing thickness may optionally be determined depending upon the display panel itself and the bonding conditions. Then, the conductive paste printed on the decal is dried to form a conductive coat 11 or 31.

Now, a dry transfer mounting method using a decal of FIG. 2 in the process for producing a display device according to the present invention will be described stepwise with reference to FIGS. 4 and 5.

Figure 4:
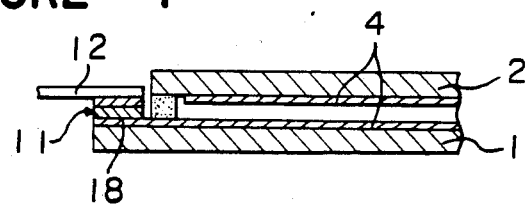
FIGS. 4 and 5 show cross sectional views illustrating the process for the dry transfer mounting according to the present invention.

FIG. 4 is a cross sectional view illustrating the manner in which a decal 16 printed with a conductive coat 11 is transferred and pressed correctly on the lead terminal portion 18 of the transparent electrode of the display panel. Then, the decal or the display panel is heated to bond the conductive coat 11 onto the transparent electrode's lead terminal portion of the display panel and base sheet 12 is peeled (heat released) by a pressure applied from the decal side or the display panel side.

Figure 5:
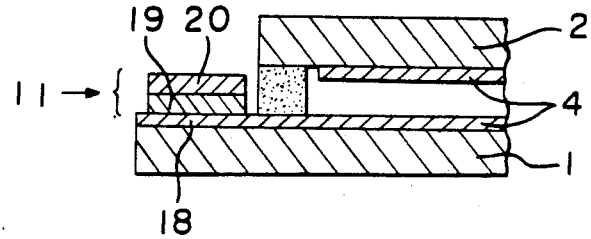

FIG. 5 is a cross sectional view illustrating a manner in which a low conductive material layer 19 and a highly conductive material layer 20 are laminated on the transparent electrode's terminal portion of the display panel.

As mentioned above, the conductive coat 11 of FIG. 5 preferably has a double-layered structure comprising a first layer 19 of a low conductive material containing from 50 to 90% by weight of a conductor material formed on the lead terminal portion 18 of the transparent electrode and a second layer 20 of a highly conductive material containing from 60 to 95% by weight of a conductor material. Whereby the bonding ability of the formed lead terminal to the transparent electrode's lead terminal portion as well as the wettability of the same lead terminal with the solder will be both improved. The conductor material contents in the low conductive material layer and the highly conductive material layer are selected within the above-mentioned ranges so that the conductor material content in the low conductive material layer is less than the conductor material content in the highly conductive material layer. The conductor material contents are determined within these ranges depending upon the type of a conductor material and a resin to be used.

The conductive coat 11 obtained by printing the conductive paste in a desired pattern is preliminarily dried, transferred onto the display panel terminal portion and then hardened. This hardening may be conducted by heating within a temperature range, usually at a temperature of from 100° to 200° C., where the constituting material of the display panel, such as the liquid crystal material or the sealing material, will not undergo deterioration. In this manner, the double-layered conductive coat is formed so that the first layer on the transparent electrode side contains from 50 to 90% by weight of the conductor material and the second layer contains from 60 to 95% by weight of the conductor material, whereby both the bonding strength of the terminal to the transparent electrode and the wettability with the solder will be satisfied.

Now, as a process for the production of the display device of the present invention, the wet transfer mounting by means of the wet transfer decal shown in FIG. 3 will be described stepwisely with reference to FIGS. 6 to 8.

Figure 6:
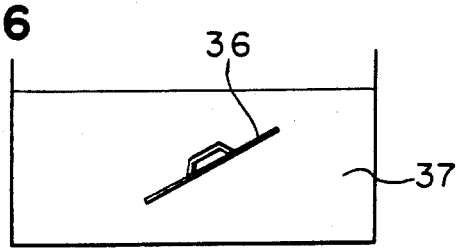
FIGS. 6 to 8 show cross sectional views illustrating a process for the wet transfer mounting according to the present invention.

FIG. 6 shows the decal 36 immersed in a liquid 37. It is common to use water as the liquid, which serves to facilitate the releasing off of the conductive coat 31 of a conductive paste from the base sheet 32.

Figure 7:
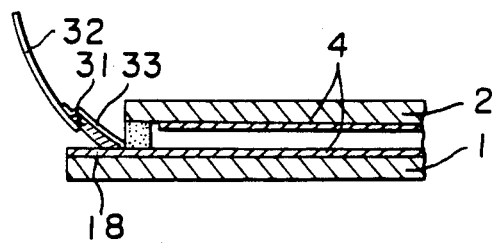
Figure 8:
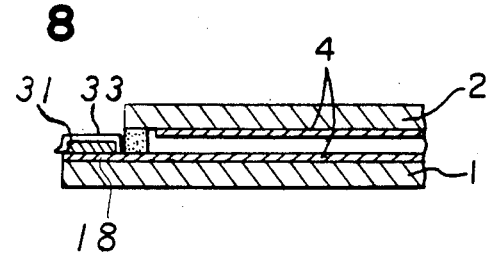

FIG. 7 shows a cross sectional view illustrating the manner what we call "a slide-off method" or "slipping off method", in which the decal 36 printed with the conductive coat 31 is transferred pressed correctly on the lead terminal portion 18 of the transparent electrode of the display panel to be bonded. Then, the conductive coat is completely hardened by drying. The top coat 33 is removed preferably before drying, whereby the conductive coat 31 formed by the conductive paste is intimately bonded to the lead terminal portion 18 as shown in FIG. 8. Like in the case of the above-mentioned dry transfer mounting, it is preferred to form this conductive coat so that a first layer of a low conductive material is located on the transparent electrode terminal portion and a second layer of a highly conductive material is located on the first layer. In this case of wet transfer mounting, the hardening is conducted also by heating at a temperature of from 100° to 200° C. as in the case of the dry transfer mounting.

In the present invention, the dry transfer mounting method or the wet transfer mounting method is employed to bond the conductive coat to the transparent electrode terminal portion, whereby, as compared with the conventional screen printing, the thickness of the conductive coat can be controlled with high precision, even a conductive coat having a large printed surface area can readily be transferred and it is thus possible to transfer the conductive coat even to a surface other than a flat surface. A further advantage is that a high speed printing is thereby possible. The printability on a surface other than a flat surface is important particularly in the case of the printing on a display panel terminal as mentioned above. The method of the present invention using a decal which allows the conductive coat to be bonded to a narrow terminal portion having a size of usually a few millimeter and closely to the sealing 3 to such an extent that the conductive coat almost extends to the sealing, is extremely superior.

Further, by using the decal of the present invention, it is made possible to obtain advantages in the printing process such that, plate scum (a printing pattern of the plate is stained and the fineness of a pattern becomes worse) hardly occurs, a loss of the paste is minimum, and the reproducibility is good.

Furthermore, according to the dry transfer mounting method or the wet transfer mounting method, the printing can be done even after the sealing of the display panel, and the thickness of the printing can readily be controlled, whereby the thickness of the conductive coat can freely and widely be selected. Whereas, in the case where the printing has to be done prior to the sealing operation as in the case of the screen printing (direct printing), there is a disadvantage that the panel gap, for instance in the case of a liquid crystal display panel, must be most 10 μm.

Further, the dry transfer mounting method does not require a liquid such as water for the transfer mounting, whereby no harmful influence due to the scattering of the liquid will be brought about and the productivity is good as compared with the wet transfer mounting method.

Figure 9:
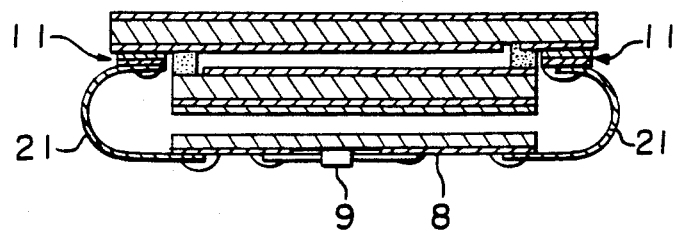
FIGS. 9 and 10 show cross sectional views illustrating an embodiment of a liquid crystal display device of the present invention.

FIG. 9 shows a cross sectional view of an embodiment of the display device of the present invention, wherein a flexible printed circuit board 21 is soldered to the conductive coat 11 transferred on the lead terminal portion of the display panel, and the flexible print circuit board is soldered to a print circuit board 8 on which an electronic component such as an IC chip 9 is mounted.

In the process of the soldering of the thick film conductor with the flexible print circuit board, after hardening the conductive coat, the thick film conductor is subjected to for instance, preliminary solder treatment, then the flexible print circuit board is pressed thereon and heat is locally applied to complete the soldering.

This preliminary solder treatment is conducted in a temperature range usually 120° to 150° C., within which the solder will adhere without deteriorating the display panel.

In this Figure, the IC chip is mounted on a printed circuit board which is separated by the flexible printed circuit board. However, the IC chip may be mounted directly on the flexible printed circuit board which is bonded to the thick film conductor.

Figure 10:
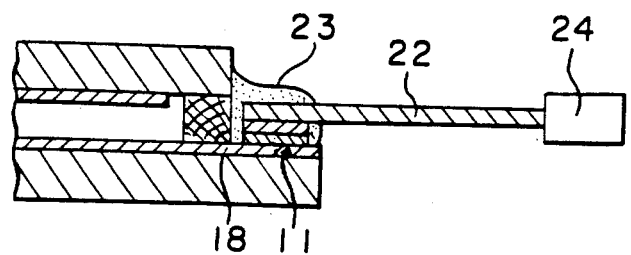

FIG. 10 shows a cross sectional view of a more preferred embodiment of the terminal portion of the display panel of the display device according to the present invention. A double-layered conductive coat 11 is formed on the lead terminal portion 18 of the transparent electrode of the display panel, preliminary solder treatment is applied thereto, a flexible printed circuit board 22 is then soldered thereto, and the solder joint portion is covered with a resin 23, whereby the reliability of the connection is improved.

As the resin 23, a thermosetting resin or an ultraviolet setting resin such as an epoxy resin may be employed as mentioned above.

Reference numeral 24 designates a connector attached to the opposite end of the flexible printed circuit board. As opposed to the embodiment of FIG. 9, the flexible printed circuit board is connected to the connector without being soldered to a print circuit board.

Figure 11:
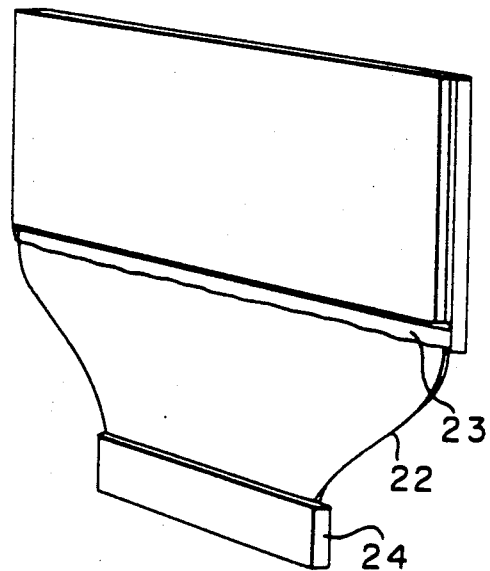
FIG. 11 is a perspective view of the embodiment shown in FIG. 10.

FIG. 11 is a perspective view of the embodiment of FIG. 10, wherein a flexible print circuit board 22 is connected at one end to the display panel and the joint portion is reinforced by a resin 23, and the other end is connected to a connector 24.

With the construction of the present invention as mentioned above, a plurality of lead terminals may readily and reliably be formed, whereby, as compared with closely spaced contacts by a conductive elastomer, a failure in the electrical connection attributable to the displacement of the connected conductive elements due to vibrations etc. is hardly brought about. Especially, fine pitch lead terminals or a number of lead terminals in a plurality of rows may be formed with high reliability, and accordingly they are suitable for display panels for vehicles, dot matrix display panels, television display panels or lens array replaceable panels for printer.

The above description is made primarily with respect to a liquid crystal display device. However, the present invention is applicable also to an electrochromic display device, a PLZT display device or an electrophoretic display device.

Further, according to the present invention, the base plate of the display panel may not be restricted to a usual glass plate, and may be a plastic base plate or a ceramics base plate.

Now, the present invention will be described with reference to Examples. However, it should be understood that the present invention is by no means restricted by these specific Examples.

EXAMPLE 1

Two silver conductive pastes having the following compositions were respectively printed on polyester film in a desired pattern by means of printing with 200 mesh (openings per inch length) stainless steel screen. One of the paste was for the first layer and the other for the second layer. The first layer was formed on the second layer.
  Second layer:
    Silver powder: 75% by weight
    Organic binder: 25% by weight
  First layer:
    Silver powder: 60% by weight
    Organic binder: 40% by weight
The organic binder for the first and second layers had the following composition.
  One pack type epoxy resin: 50% by weight
  Butyl cellosolve (ethylene glycol monobutyl ether): 50% by weight The decal thus obtained was pressed on a lead terminal portion of a transparent electrode of a display panel, heated to 100° C. and heat-bonded under a pressure of 6 kg/cm². After cooling, the film was released off, and the conductive coat left on the lead terminal portion was hardened by heating to about 150° C. for 1 hour thereby to obtain a thick film conductor comprising a first layer containing 75% by weight of silver (low conductive material layer) and a second layer containing 86% by weight of silver (highly conductive material layer). Then, the thick film conductor so obtained was subjected to preliminary solder treatment by dipping it in a molten solder (Sn: 60% by weight, Pb: 38% by weight, Ag: 2% by weight) at about 200° C., and a flexible print circuit board likewise subjected to preliminary soldering treatment was bonded thereto by heat-pressing.

At the conductively connected portion of this display device, the conductive coat had a double-layered structure and was firmly bonded to both the transparent electrode and the flexible printed circuit board. The connected portion was hardly peeled as compared with the case where the conductive coat has a single layered structure.

EXAMPLE 2

On a base sheet of a decal obtained by coating a water soluble adhesive on a pulp paper and laminating thereon a polyester film having a thickness of 25 μm by heat-pressing, two copper conductive pastes having the following compositions were printed stepwise in a desired pattern by means of a 200 mesh stainless steel screen to obtain a decal having a double-layered structure.
  Second layer:
    Copper flakes: 80% by weight
    Organic binder: 20% by weight
  First layer:
    Copper flakes: 60% by weight
    Organic binder: 40% by weight
The organic binder for the first and second layers had the following composition.
  One pack type epoxy resin: 50% by weight
  Butyl cellosolve: 50% by weight The decal so obtained was pressed on a lead terminal portion of a transparent electrode of a display panel, heated to 100° C. and heat-bonded under pressure of 6 kg/cm². Then, the laminated paper was peeled off, and the conducitve coat left on the lead terminal portion was hardened by heating to about 160° C. for 20 minutes thereby to obtain a thick film conductor comprising a first layer containing 75% by weight of copper and a second layer containing 89% by weight of copper. Then, the thick film conductor was subjected to preliminary soldering treatment by dipping it in molten solder (Sn: 60% by weight, Pb: 39.7% by weight, Cu: 0.3% by weight) at about 200° C. and then a flexible print circuit board likewise subjected to preliminary soldering treatment was bonded thereto by heat-pressing.

At the conductively connected portion of this display device, the conductive coat had a double-layered structure and was firmly bonded to both the transparent electrode and the flexible printed circuit board. The connected portion was hardly peeled as compared with the conductive coat having a single-layered structure.

EXAMPLES 3 and 4

The connected portion of the display device in each of Examples 1 and 2 was coated with an ultraviolet ray hardenable resin containing 60% by weight of silica particles, as indicated in FIG. 10 and then subjected to ultraviolet treatment for 10 minutes for hardening and sealing. The terminal portion thus obtained did not allow the transparent electrode to be exposed and did not cause its galvanic corrosion even when used at a highly humid place. In addition the strength of bond between the flexible printed circuit board and the terminal was improved.

EXAMPLE 5

A water-absorptive base paper was coated with a dextrin adhesive (starch gum) to obtain a base sheet for decal, and a silver conductive paste having the following commposition was printed in a desired pattern on the base sheet by means of a 200 mesh stainless steel screen thereby to obtain a decal.

Silver powder: 70% by weight
Organic binder: 30% by weight
The organic binder had the following composition.
One pack type epoxy resin: 40% by weight
Butyl cellosolve: 60% by weight A top coat having the following composition was coated by screen printing on the printed surface to obtain a top coat-covered decal.
Methacrylic resin: 40% by weight
Solbesso 150 (high boiler manufactured by Esso Standard): 38% by weight
Isopropyl alcohol: 20% by weight
Surfactant ("Separl 441" manufactured by Chukyo Yushi): 2% by weight The top coat-covered decal thus obtained was dipped in water and the base sheet was removed from the top coat having the printed pattern. The top coat having the printed pattern was pressed on a lead terminal portion of a transparent electrode of a display panel in this manner what we call "a slide-off method" ("slipping off method"). After drying, the top coat was peeled off, and the remaining conductive coat was hardened by heating to about 150° C. for 1 hour thereby to obtain a thick film conductor having a silver content of 85% by weight.

The thick film conductor so obtained was subjected to preliminary soldering treatment by dipping it in molten solder (Sn: 60% by weight, Pb: 38% by weight, Ag: 2% by weight) at about 200° C., and a flexible printed circuit board likewise subjected to preliminary soldering treatment was bonded thereto by heat-pressing.

EXAMPLE 6

A water-absorptive base paper was coated with a dextrin adhesive (starch gum) to obtain a base sheet for decal, and two copper conductive pastes having the following compositions were printed stepwise in a desired pattern on the base sheet by means of a 200 mesh stainless steel screen thereby to obtain a decal.
Second layer:
    Copper flakes: 80% by weight
    Organic binder: 20% by weight
First layer:
    Copper flakes: 60% by weight
    Organic binder: 40% by weight The organic binder for the first and second layers had the following composition.
One pack type epoxy resin: 40% by weight
Butyl cellosolve: 60% by weight A top coat having the following composition was coated by screen printing on the printed surface to obtain a top coat-covered decal.
Ethyl cellulose: 15% by weight
Natural rosin: 10% by weight
Butyl lactate: 40% by weight
Butyl cellosolve: 35% by weight The top coat-covered decal thus obtained was dipped in water, and the base sheet was removed from the top coat having the printed pattern. The top coat having the printed pattern was transferred onto a lead terminal portion of a transparent electrode of a display panel in this manner what we call "a slide-off method". After drying, the top coat was peeled off, and the conductive coat was hardened by heating to about 150° C. for 1 hour thereby to obtain a thick film conductor comprising a first layer having a copper content of 79% by weight and a second layer having a copper content of 91% by weight.

The thick film conductor was subjected to preliminary soldering treatment by dipping it in molten solder (Sn: 60% by weight, Pb: 39.7% by weight, Cu: 0.3% by weight) at about 200° C., and a flexible printed circuit board likewise subjected to preliminary soldering treatment was bonded thereto by heat pressing.

At the conductively connected portion of this display device, the conductive coat had a double-layered structure, and was firmly bonded to both the transparent electrode and the flexible print circuit board. The connected portion was hardly peeled as compared with the conductive coat having a single-layered structure.

As described in the foregoing, the present invention provides the following advantages.

(1) A display panel can be processed in the cell form after it being sealed, whereby no change is required in the conventional production steps, and the productivity will not be reduced.
(2) The formation of the conductor is possible even at a uneven portion of the display panel e.g. at aportion of a step.
(3) A bond can be effected by soldering, whereby reliable bonding is obtainable. It is thereby possible to form a number of lead terminals with fine patterns and to obtain a larger display surface area in the display panel.
(4) The thickness of the conductive coat can readily be controlled and can be widely varied.
(5) Plate scum is hardly brought about.
(6) A loss of the conductive paste is minimum.
(7) Migration will be prevented by using a base metal paste.
(8) In the case of the dry transfer mounting method, no liquid such as water is used, whereby no problems such as scattering of the liquid and disposal of waste water etc. are raised, and the productivity is good.
(9) By virtue of the double-layered condutive coat, the bonding of the coat to the transparent electrode terminal's portion is good and the solderability thereof to the flexible print circuit board is also good.
(10) The conductive coat is formed by using a decal on which a conductive paste is printed and the elongation of the decal is minimized. Consequently, especially in the case of the dry transfer mounting method, automation can readily be done.
(11) The wet transfer mounting may readily be conducted either by manual operation or mechanical operation. Accordingly it has a wide range of applications.

Thus, the present invention is applicable not only to the liquid crystal display device but also to various other display devices.

We claim:

1. A display device comprising:
a display panel having a transparent electrode terminal;
a thick film conductor bonded to said transparent electrode terminal by a transfer mounting method using a transfer decal, said thick film conductor comprising first and second layers, said first layer being bonded on said transparent electrode terminal; and
a flexible printed circuit cable having a conductor soldered onto said second layer, the composition of said first layer being low in conductivity and including a resin and a conductive material, the composition of said second layer being high in conductivity and including a resin and a conductive material.

2. The display device according to claim 1, wherein the highly conductive material is a thermosetting conductive material containing from 60 to 95% by weight of a conductor material, and the low-conductive material has a less content of a conductor material than the highly conductive material and is a thermosetting conductive material containing from 50 to 90% by weight of a conductor material.

3. The display device according to claim 1, wherein the solder joint portion of the thick film conductor and the flexible printed circuit board is covered with a resin.

4. The display device according to claim 1, wherein the display panel is a passive optical display panel.

5. The display device according to claim 4, wherein the passive optical display panel is a liquid crystal display panel.

6. The display device according to claim 1, wherein the thick film conductor is formed by a dry transfer mounting method.

7. The display device according to claim 1, wherien the thick film conductor is formed by a wet transfer mounting method.

* * * * *